(12) United States Patent
Ryu et al.

(10) Patent No.: US 11,373,960 B2
(45) Date of Patent: Jun. 28, 2022

(54) ELECTRONIC COMPONENT MODULE

(71) Applicant: Samsung Electro-Mechanics Co., Ltd., Suwon-si (KR)

(72) Inventors: Myung Lim Ryu, Suwon-si (KR); Kwang Ju Choi, Suwon-si (KR); Da Un Kim, Suwon-si (KR); Duck Whan Kim, Suwon-si (KR); Dong Hyeon Lee, Suwon-si (KR); Kyoung Min Kim, Suwon-si (KR); Ik Su Shin, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/852,751

(22) Filed: Apr. 20, 2020

(65) Prior Publication Data

US 2021/0159186 A1 May 27, 2021

(30) Foreign Application Priority Data

Nov. 21, 2019 (KR) .......................... 10-2019-0150654

(51) Int. Cl.
*H01L 23/552* (2006.01)
*H01L 21/56* (2006.01)
*H01L 21/48* (2006.01)
*H01L 23/485* (2006.01)
*H01L 23/498* (2006.01)
(Continued)

(52) U.S. Cl.
CPC ........ *H01L 23/552* (2013.01); *H01L 21/4846* (2013.01); *H01L 21/561* (2013.01); *H01L 23/3121* (2013.01); *H01L 23/485* (2013.01); *H01L 23/498* (2013.01); *H01L 24/16* (2013.01); *H01L 24/97* (2013.01); *H01L 2224/16227* (2013.01); *H01L 2224/97* (2013.01); *H01L 2924/3025* (2013.01)

(58) Field of Classification Search
CPC ... H01L 23/552; H01L 21/4846; H01L 24/97; H01L 24/16; H01L 23/3121; H01L 21/561; H01L 23/485; H01L 23/498; H01L 2224/97; H01L 2924/3025; H01L 2224/16227
USPC .......................................................... 257/659
See application file for complete search history.

(56) References Cited

U.S. PATENT DOCUMENTS 9,385,090 B2 * 7/2016 Shibuya .............. H01L 23/3128
10,825,782 B2 * 11/2020 Dhakal ................. H01L 21/561
(Continued)

FOREIGN PATENT DOCUMENTS

JP 2017-147341 A 8/2017
KR 10-2012-0024284 A 3/2012
KR 10-2015-0142210 A 12/2015

*Primary Examiner* — Vu A Vu
(74) *Attorney, Agent, or Firm* — NSIP Law

(57) ABSTRACT

An electronic component module includes: a substrate; an electronic element disposed on a first surface of the substrate; an encapsulant disposed on the first surface of the substrate and configured to seal the electronic element; a first pad disposed on an outermost region of a second surface of the substrate; a second pad disposed inward of the first pad on the second surface of the substrate, and positioned parallel to the first pad; and a shielding layer connected to the first pad, and at least partially surrounding a side surface of the encapsulant and a side surface of the substrate. The first and second pads are electrically connected by a connection pad.

17 Claims, 5 Drawing Sheets

(51) Int. Cl.
*H01L 23/00* (2006.01)
*H01L 23/31* (2006.01)

(56) References Cited

U.S. PATENT DOCUMENTS

2016/0276288 A1* 9/2016 Lee .................. H01L 23/552
2017/0062360 A1* 3/2017 Chang ................ H01L 21/78
2017/0236786 A1 8/2017 Suzuki

* cited by examiner

ELECTRONIC COMPONENT MODULE

CROSS-REFERENCE TO RELATED APPLICATIONS

This application claims the benefit under 35 U.S.C. § 119(a) of Korean Patent Application No. 10-2019-0150654 filed on Nov. 21, 2019 in the Korean Intellectual Property Office, the entire disclosure of which is incorporated herein by reference for all purposes.

BACKGROUND

1. Field

The following description relates to an electronic component module.

2. Description of Related Art

Most mobile devices such as smartphones, tablets, and the like currently use a wireless connection element such as Bluetooth or the like, for connection with external and internal networks.

A communications module may have a radio frequency (RF) transmission/reception terminal for transmitting and receiving data to and from an external element, and an input and output terminal capable of transmitting the received data to a device without loss.

However, unwanted electromagnetic waves may be radiated or introduced from each of the terminals during transmission and reception of an RF signal, and input and output of data.

Accordingly, a need exists for a technology capable of shielding the electromagnetic waves in a communications module that implements each radio standard.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic component module includes: a substrate; an electronic element disposed on a first surface of the substrate; an encapsulant disposed on the first surface of the substrate and configured to seal the electronic element; a first pad disposed on an outermost region of a second surface of the substrate; a second pad disposed inward of the first pad on the second surface of the substrate, and positioned parallel to the first pad; and a shielding layer connected to the first pad, and at least partially surrounding a side surface of the encapsulant and a side surface of the substrate. The first and second pads are electrically connected by a connection pad.

The connection pad may include a plurality of connection pads spaced apart from each other.

The second pad may have a strip shape corresponding to a planar shape of the substrate.

The second pad may include a plurality of second pads spaced apart from each other. The plurality of second pads may be disposed in the form of a segmented line.

The electronic component module may further include connection electrodes configured to electrically connect to a main substrate, and disposed inward of the second pad on the second surface of the substrate.

The substrate may include a grounding wiring layer connected to the shielding layer.

The grounding wiring layer may be exposed from the side surface of the substrate and connected to the shielding layer.

In another general aspect, an electronic component module includes: substrate; an encapsulant encapsulating a first electronic element disposed on a first surface of the substrate; an auxiliary substrate disposed on a second surface of the substrate and having a through-hole in which an electronic element is inserted; a first pad disposed on an outermost region of a lower surface of the auxiliary substrate; a second pad disposed inward of the first pad on the lower surface of the auxiliary substrate, and positioned parallel to the first pad; and a shielding layer connected to the first pad and disposed to at least partially surround a side surface of the encapsulant, a side surface of the substrate, and a side surface of the auxiliary substrate. The first and second pads are electrically connected by a connection pad.

The connection pad may include a plurality of connection pads spaced apart from each other.

The second pad may have a strip shape corresponding to a planar shape of the auxiliary substrate.

The second pad may include a plurality of second pads spaced apart from each other. The plurality of second pads may be disposed in the form of a segmented line.

The substrate may include a grounding wiring layer connected to the shielding layer.

The grounding wiring layer may be exposed from the side surface of the substrate and connected to the shielding layer.

In another general aspect, an electronic component module includes: a main substrate; a substrate disposed on the main substrate; an electronic element disposed on a first surface of the substrate; an encapsulant disposed on the first surface of the substrate and configured to seal the electronic element; a first pad disposed on an outermost region of a second surface of the substrate; a second pad disposed inward of the first pad on the second surface of the substrate, and positioned parallel to the first pad; a shielding layer connected to the first pad and disposed to at least partially surround a side surface of the encapsulant and a side surface of the substrate; and a shielding solder disposed in a space between the second pad and the main substrate. The first and second pads are electrically connected by a connection pad.

The electronic component module may further include connection electrodes electrically connected to the main substrate, and disposed inward of the second pad on the second surface of the substrate.

The first pad may be disposed along a substantially entire periphery of the second surface of the substrate.

Other features and aspects will be apparent from the following detailed description, the drawings, and the claims.

Figure 1:
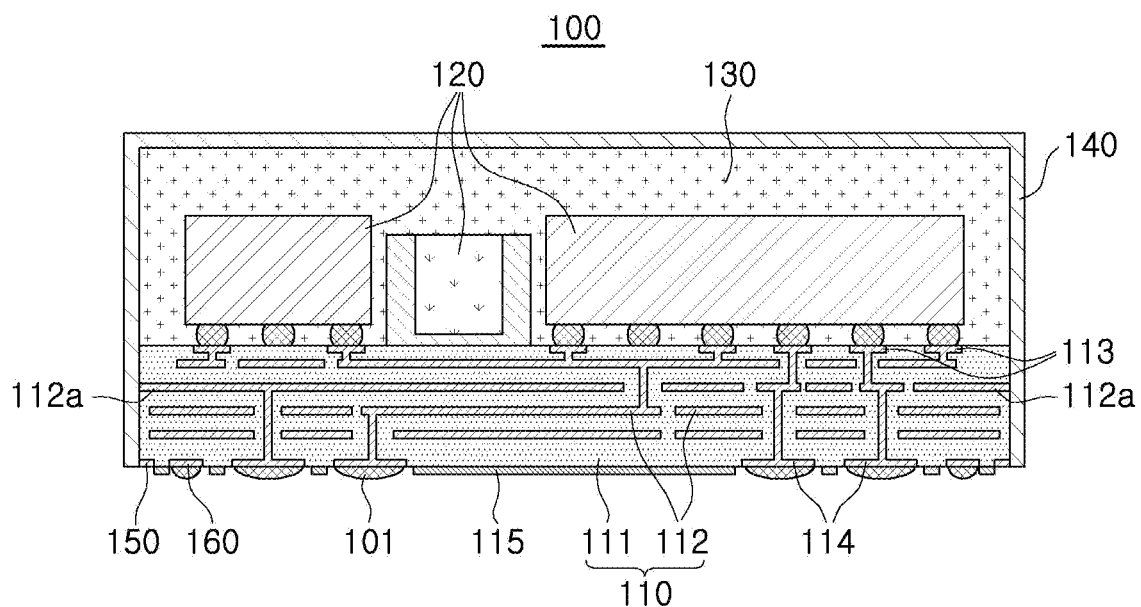
FIG. 1 is a schematic cross-sectional view illustrating an electronic component module, according to an embodiment.

Throughout the drawings and the detailed description, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
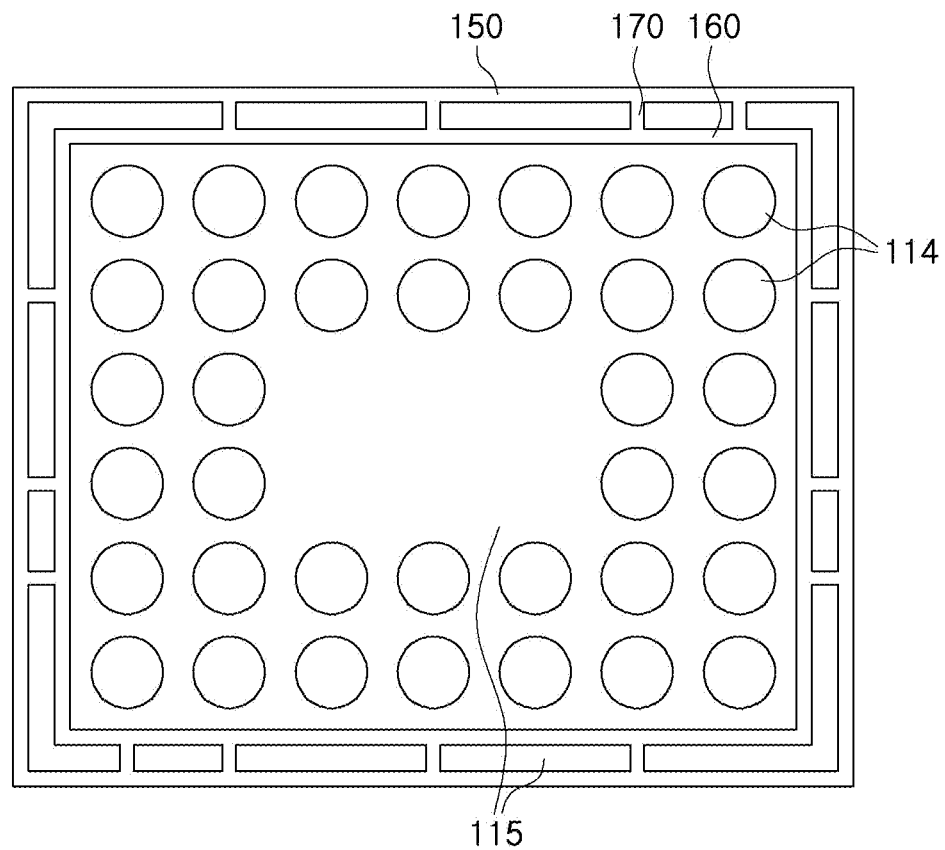
FIG. 2 is a bottom view illustrating a substrate and first and second pads of the electronic component module of FIG. 1, according an embodiment.

FIG. 1 is a schematic cross-sectional view illustrating an electronic component module 100, according to an embodiment. FIG. 2 is a bottom view illustrating a substrate and first and second pads of the electronic component module 100.

Referring to FIGS. 1 and 2, the electronic component module 100 may include, for example, a substrate 110, an electronic element 120, an encapsulant 130, a shielding layer 140, a first pad 150, and a second pad 160.

For example, the substrate 110 may be a multilayer substrate in which insulating layers 111 wiring layers 112 are repeatedly formed in alternating order. Mounting electrodes 113 and connection electrodes 114 may be respectively formed on two opposing surfaces of the insulating layers 111. For example, the mounting electrodes 113 may be disposed on an upper surface of an uppermost insulating layer 111, which forms a first, upper surface of the substrate 110, and the connection electrodes 114 may be formed on a lower surface of lowermost insulating layer 111, which forms a second, lower surface of the substrate 110. For example, various types of substrates (e.g., printed circuit boards, flexible substrates, ceramic substrates, glass substrates, or the like) well known in the art, may be used as the substrate 110.

A material of the insulating layers 111 is not specifically limited. For example, a thermosetting resin such as an epoxy resin, a thermoplastic resin such as a polyimide, or a resin composition in which a thermosetting resin or a thermoplastic resin is impregnated with a core such as glass fiber, glass cloth, or glass fabric together with an inorganic filler, for example, insulating materials such as prepreg, Ajinomoto Build-up Film (ABF), FR-3, or bismaleimide triazine (BT), may be used to form the insulating layers 111.

The wiring layers 112 may be electrically connected to the electronic element 120, which will be described later in more detail.

A conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like may be used as a material of the wiring layers 112.

In addition, a protective insulation layer 115 may be disposed on a surface of the substrate 110. The protective insulation layer 115 may be formed of a solder resist, and may be disposed to cover the insulating layers 111 and the wiring layers 112 on either one or both of an upper surface of an uppermost insulating layer 111 and a lower surface of a lowermost insulating layer 111.

The substrate 110 may include the first surface and the second surface, opposite to the first surface, as described above. The first surface may be a surface on which the electronic element 120 is mounted. The second surface may be a surface facing a main substrate when the electronic component module 100 is mounted on the main substrate.

The mounting electrodes 113 may be configured for mounting the electronic element 120, and may be disposed on the first surface of the substrate 110. In addition, the connection electrodes 114 may be configured for bonding connection terminals 101 such as solder balls, and may be disposed on the second surface of the substrate 110. In addition, at least one of the mounting electrodes 113 may be configured as a ground electrode.

In addition, the wiring layers 112 of the substrate 110 may include a grounding wiring layer 112a connected to the shielding layer 140.

The electronic element 120 may be disposed on the first surface of the substrate 110. The electronic element 120 may be one or more of various elements such as an active element and a passive element. For example, any element or component that is mounted on the substrate 110 may be used as the electronic element 120.

In addition, the electronic element 120 may include an element that should be protected from electromagnetic waves emitted or introduced externally during an operation.

The electronic element 120 may be mounted on the substrate 110 through a connection terminal such as a plurality of solder balls.

The encapsulant 130 may encapsulate the electronic element 120. The encapsulant 130 may fix the electronic element 120 in an externally surrounding manner, to securely protect the electronic element 120 from external shocks. That is, the encapsulant 130 may externally surround the electronic element to encapsulate the electronic element 120 and fix the electronic element 120 therein.

The encapsulant 130, according to an example, may be formed of an insulating material. For example, the encapsulant 130 may be formed of a resin material such as epoxy molding compound (EMC), but is not limited to an EPC. In another example, the encapsulant 130 may be formed of a conductive material (for example, a conductive resin or the like). In such an example, a separate encapsulant such as an underfill resin may be provided between the electronic element 120 and the substrate 110.

The shielding layer 140 may be disposed to surround an upper surface and a side surface of the encapsulant 130 and a side surface of the substrate 110. The shielding layer 140 may be formed of a conductive material. For example, the shielding layer 140 may be formed by applying a resin material containing conductive powder particles or forming a metal thin film on an outer surface of the encapsulant 130. In the case of forming the metal thin film, various techniques such as a sputtering process, a screen-printing process, a vapor deposition process, an electrolytic plating process, an electroless plating process, or the like, may be used.

Since the shielding layer 140 is disposed to surround the upper and side surfaces of the encapsulant 130 and the side surface of the substrate 110, the shielding layer 140 may increase an electromagnetic shielding effect and improve heat dissipation efficiency.

In addition, the shielding layer 140 may prevent or resist peeling of the encapsulant 130.

The shielding layer 140 may be connected to the first pad 150, which is disposed on an outermost lower surface of the substrate 110.

The first pad 150 may be disposed on an outermost region of the second, lower surface of the substrate 110. For example, the first pad 150 may have a rectangular band shape. The first pad 150 is not limited to having a rectangular band shape, and may be changed in various ways. The first pad 150 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. In addition, the first pad 150 may be configured as a connection electrode to be connected to the shielding layer 140.

The second pad 160 may be disposed at an edge of the substrate 110, on an outer region of the second, lower surface of the substrate 110, and adjacent to or spaced apart from the first pad 150 in a medial direction. For example, the second pad 160 may have a shape corresponding to a shape of the first pad 150. For example, the second pad 160 may be disposed in parallel with the first pad 150 in a medial direction. In addition, the second pad 160 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. When the electronic component module 100 is mounted on the main substrate (not illustrated), the second pad 160 may function as a shielding pad for preventing inflow and radiation of electromagnetic waves through a lower portion of the substrate 110. For example, when the electronic component module 100 is mounted on the main substrate (not illustrated), a shielding solder may be bonded to the second pad 160 to form a shielding wall to prevent the inflow and radiation of electromagnetic waves. For example, since a space of the second pad 160 in a medial direction forms a space sealed by the shielding solder bonded to the second pad 160, the inflow and radiation of electromagnetic waves may be prevented.

In addition, the second pad 160 may be connected to the first pad 150 through a connection pad 170 for grounding.

As described above, the electromagnetic waves may be prevented from radiating from the lower portion of the substrate 110 through the second pad 160, or the electromagnetic waves may be introduced into the lower portion of the substrate 110.

Figure 3:
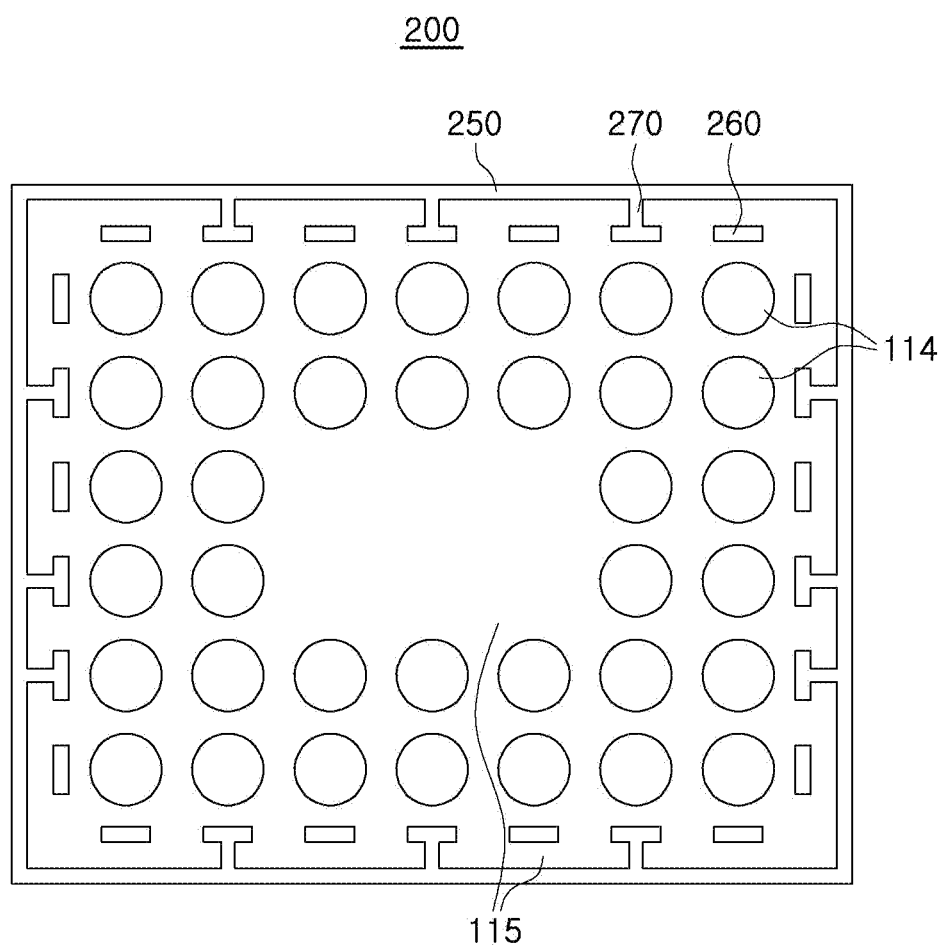
FIG. 3 is a bottom view illustrating a substrate and first and second pads of an electronic component module, according to an embodiment.

FIG. 3 is a bottom view illustrating a substrate and first and second pads of an electronic component module 200, according to an embodiment.

Referring to FIG. 3, a first pad 250 may be disposed on an outermost region of the second, lower surface of the substrate 110 (see FIG. 1). For example, the first pad 250 may have a rectangular band shape. A shape of the first pad 250 is not limited to having a rectangular band shape, and may be changed. The first pad 250 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. In addition, the first pad 250 may be configured as a connection electrode to be connected to the shielding layer 140 (see FIG. 1).

A second pad 260 may be disposed at an edge of the substrate 110 (see FIG. 1), on an outer region of the second, lower surface of the substrate 110, and adjacent to or spaced apart from the first pad 250 in a medial direction. For example, the second pad 260 may be provided as a plurality of second pads 260 spaced apart from each other, and the plurality of second pads 260 may be disposed in a segmented line shape. In addition, the second pad 260 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. When the electronic component module 200 is mounted on the main substrate (not illustrated), the second pad 260 may function as a shielding pad for preventing inflow and radiation of electromagnetic waves through the lower portion of the substrate 110. For example, when the electronic component module 200 is mounted on the main substrate (not illustrated), a shielding solder may be bonded to the second pad 260 to form a shielding wall to prevent the inflow and radiation of electromagnetic waves. For example, since a space of the second pad 260 in a medial direction forms a space sealed by the shielding solder bonded to the second pad 260, the inflow and radiation of electromagnetic waves may be prevented.

In addition, a portion of the second pads 260 may be connected to the first pad 250 through a connection pads 270 for grounding.

As described above, the electromagnetic wave may be prevented from radiating from the lower portion of the substrate 110 through the second pad 260, or the electromagnetic wave may be introduced into the lower portion of the substrate 110.

Figure 4:
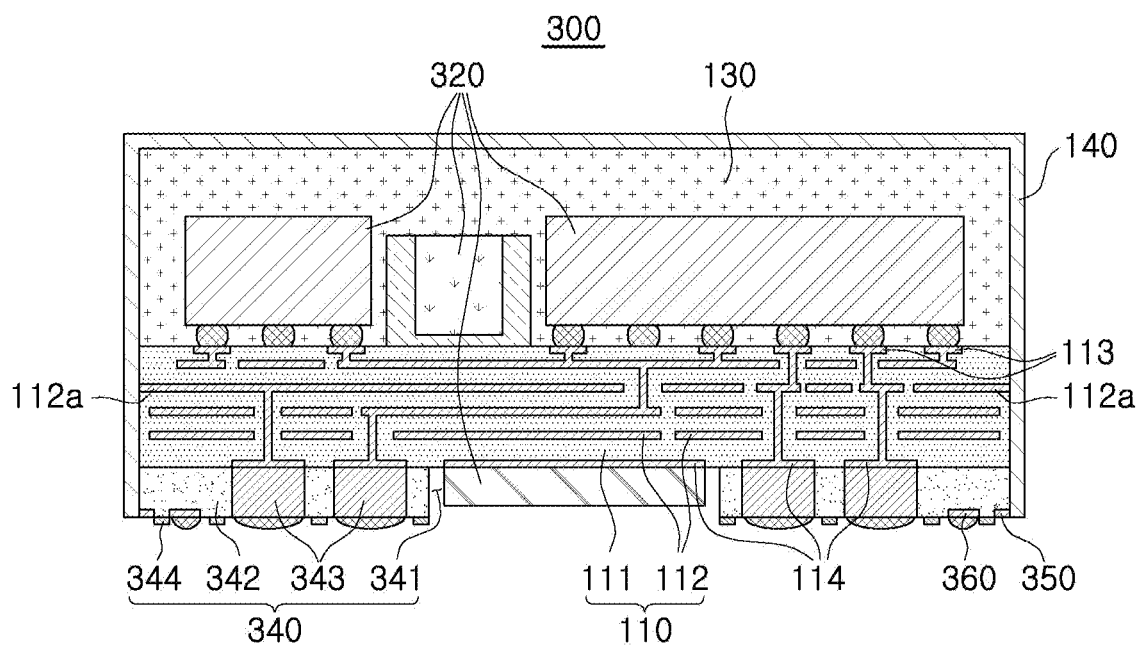
FIG. 4 is a cross-sectional view illustrating an electronic component module, according to an embodiment.
Figure 5:
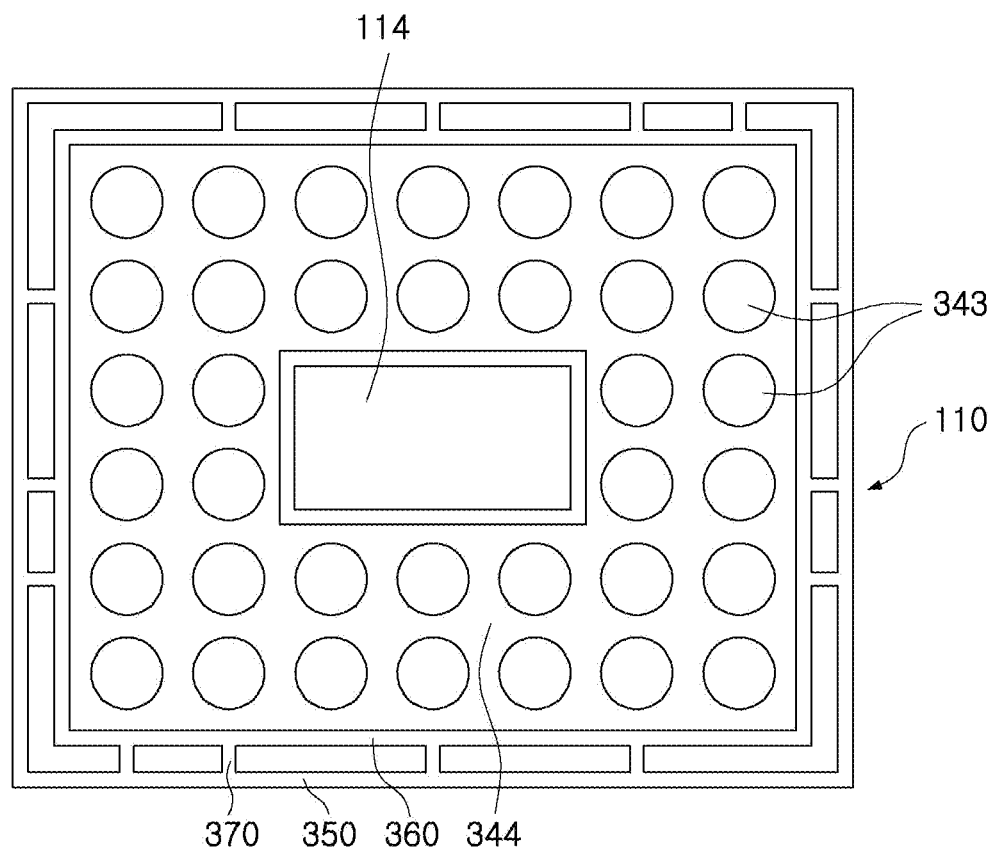
FIG. 5 is a bottom view illustrating an auxiliary substrate and first and second pads of an electronic component module, according to an embodiment.

FIG. 4 is a cross-sectional view illustrating an electronic component module 300, according to an embodiment. FIG. 5 is a bottom view illustrating an auxiliary substrate 340 and first and second pads 350, 360 of the electronic component module 300.

Referring to FIGS. 4 and 5, the electronic component module 300 may include, for example, the substrate 110, an electronic element 320, the encapsulant 130, an auxiliary substrate 340, the shielding layer 140, a first pad 350, and a second pad 360.

Since the substrate 110 and the encapsulant 130 have substantially the same configurations provided in the electronic component module 100 of FIGS. 1 and 2, a detailed description of the substrate 110 and the encapsulant 130 will not be repeated.

The electronic element 320 may be disposed on the first, upper surface and the second, lower surface of the substrate 110. The electronic element 320 may be one or more of various elements such as an active element and a passive element. For example, any element or component that is mounted on the substrate 110 may be used as the electronic element 320. The electronic element 320 disposed on the second surface of the substrate 110 may be disposed in a through-hole 341 of the auxiliary substrate 340.

In addition, the electronic element 320 may include an element that should be protected from electromagnetic waves emitted or introduced externally The encapsulant 130 may encapsulate a portion of the electronic element 320 disposed on the one surface of the substrate 110. The encapsulant 130 may fix the electronic element 320, which is disposed on the first surface of the substrate 110, in an externally surrounding manner, to securely protect the electronic element 320 from external shocks.

The encapsulant 130 may be formed of an insulating material. For example, the encapsulant 130 may be formed of a resin material such as epoxy molding compound (EMC), but is not limited to an EMC. The encapsulant 130 may be formed of a conductive material (for example, a conductive resin or the like). In such an example, a separate encapsulant such as an underfill resin may be provided between the electronic element 320 and the substrate 110.

The auxiliary substrate 340 may be disposed on the second surface of the substrate 110. The through-hole 341 in which the electronic element 320 is inserted may be formed in the auxiliary substrate 340. The auxiliary substrate 340 may include an insulating layer 342 and at least one via 343. For example, the auxiliary substrate 340 may be any one of a printed circuit board, a flexible substrate, a ceramic substrate, and a glass substrate.

A material of the insulating layer 342 is not specifically limited. For example, a thermosetting resin such as an epoxy resin, a thermoplastic resin such as polyimide, or a resin composition in which a thermosetting resin or a thermoplastic resin is impregnated with a core such as glass fiber, glass cloth, or glass fabric together with an inorganic filler, for example, insulating materials such as prepreg, Ajinomoto Build-up Film (ABF), FR-3, or bismaleimide triazine (BT), may be used as a material of the insulating layer 342.

The via 343 may be connected to a connection pad 114 of the substrate 110. A conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like may be used as a material of the via 343.

A protective insulation layer 344 may be disposed on a lower surface of the auxiliary substrate 340. The protective insulation layer 344 may be formed of a solder resist, for example.

The shielding layer 140 may be disposed to surround an upper surface and a side surface of the encapsulant 130, a side surface of the substrate 110, and a side surface of the auxiliary substrate 340. The shielding layer 140 may be formed of a conductive material. For example, the shielding layer 140 may be formed by applying a resin material containing conductive powder particles or forming a metal thin film on an outer surface of the encapsulant 130. In the case of forming the metal thin film, various techniques such as a sputtering process, a screen-printing process, a vapor deposition process, an electrolytic plating process, an electroless plating process, or the like may be used.

Since the shielding layer 140 is disposed to surround the upper and side surfaces of the encapsulant 130, the side surface of the substrate 110, and the side surface of the auxiliary substrate 340, the shielding layer 140 may increase an electromagnetic shielding effect and improve heat dissipation efficiency.

In addition, the shielding layer 140 may prevent or resist peeling of the encapsulant 130.

The shielding layer 140 may be connected to the first pad 350, which may be disposed on an outermost region of the lower surface of the auxiliary substrate 340.

For example, the first pad 350 may have a rectangular band shape. The first pad 350 is not limited to having a rectangular band shape, and may be changed in various ways. The first pad 350 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. In addition, the first pad 350 may be configured as a connection electrode to be connected to the shielding layer 140.

The second pad 360 may be disposed at an edge of the auxiliary substrate 340, on an outer region of the lower surface of the auxiliary substrate 340, and adjacent to or spaced apart from the first pad 350 in a medial direction. For example, the second pad 360 may have a shape corresponding to a shape of the first pad 350. For example, the second pad 360 may be disposed in parallel with the first pad 350 in a medial direction. In addition, the second pad 360 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. When the electronic component module 300 is mounted on the main substrate (not illustrated), the second pad 360 may function as a shielding pad for preventing inflow and radiation of electromagnetic waves through a lower portion of the auxiliary substrate 340. For example, when the electronic component module 300 is mounted on the main substrate (not illustrated), a shielding solder may be bonded to the second pad 360 to form a shielding wall to prevent the inflow and radiation of electromagnetic waves. For example, since a space of the second pad 360 in a medial direction forms a space sealed by the shielding solder bonded to the second pad 360, the inflow and radiation of electromagnetic waves may be prevented.

In addition, the second pad 360 may be connected to the first pad 350 through a connection pad 370 for grounding.

Figure 6:
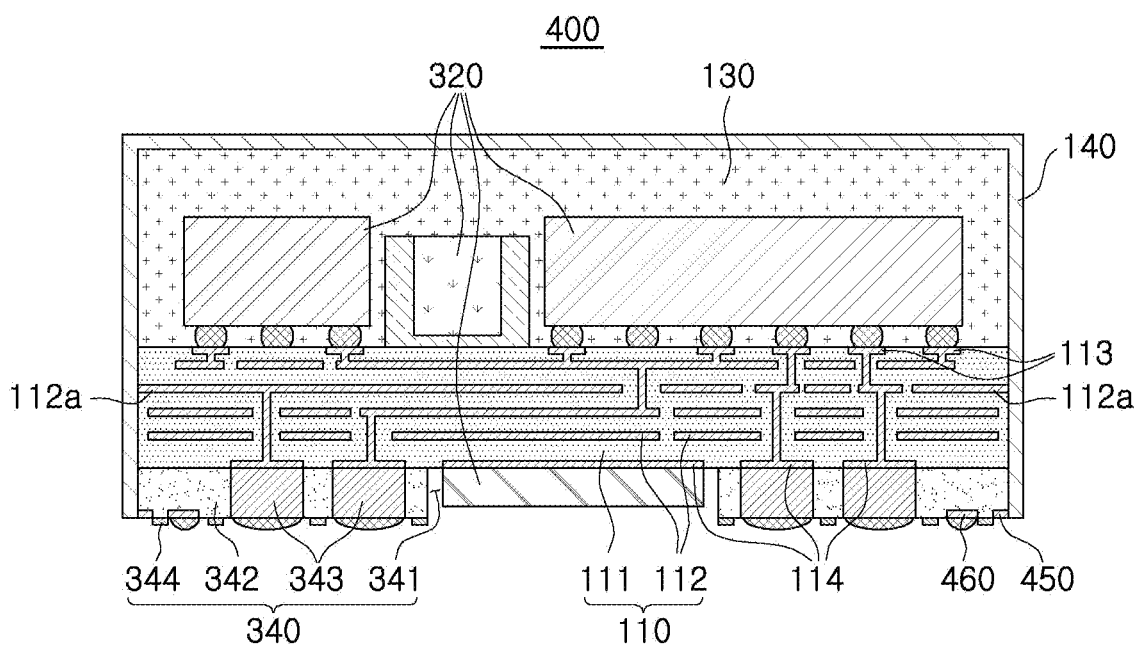
FIG. 6 is a cross-sectional view illustrating an electronic component module, according to an embodiment.
Figure 7:
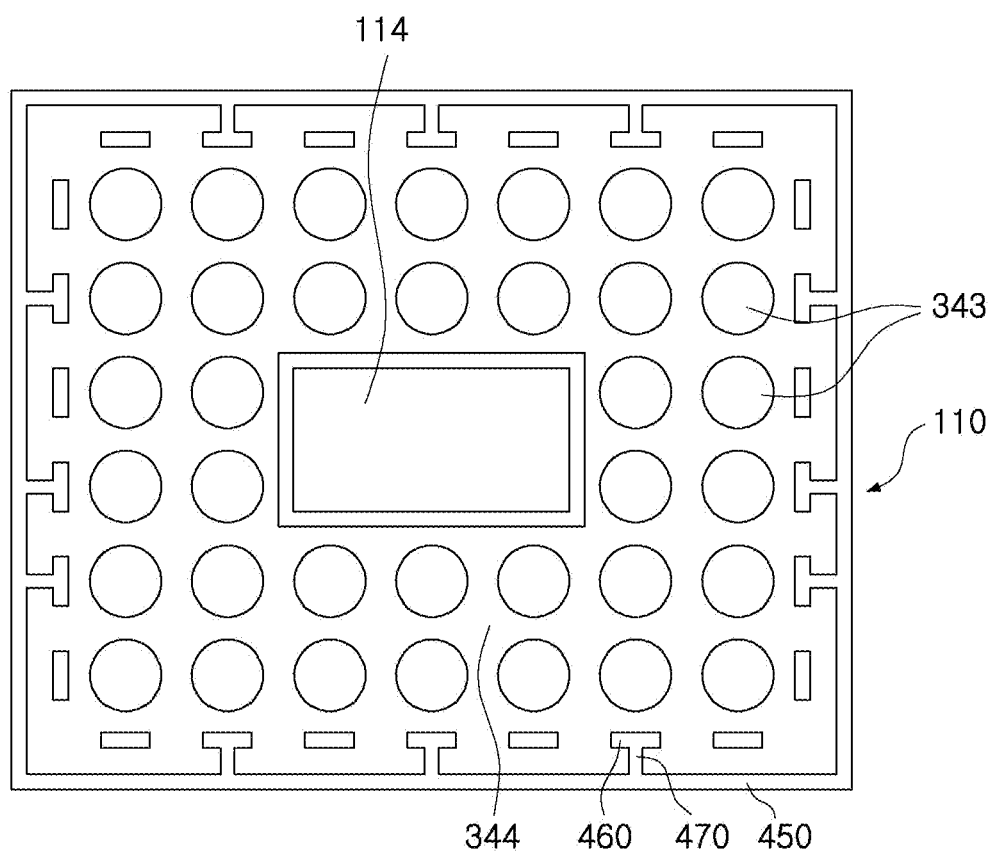
FIG. 7 is a bottom view illustrating an auxiliary substrate and first and second pads of the electronic component module according to an embodiment.

FIG. 6 is a cross-sectional view illustrating an electronic component module 400, according to an embodiment. FIG. 7 is a bottom view illustrating an auxiliary substrate and first and second pads of the electronic component module 400.

Referring to FIGS. 6 and 7, the electronic component module 400 may include, for example, the substrate 110, the electronic element 320, the encapsulant 130, the auxiliary substrate 340, the shielding layer 140, a first pad 450, and a second pad 460.

Since the substrate 110 and the encapsulant 130 have substantially the same configurations provided in the electronic component module 100 of FIGS. 1 and 2, a detailed description of the substrate 110 and the encapsulant 130 will not be repeated.

In addition, since the electronic element 320, the auxiliary substrate 340, and the shielding layer 140 have substantially the same configurations provided in the electronic component module 300 of FIGS. 4 and 5, a detailed description of the electronic element 320, the auxiliary substrate 340, and the shielding layer 140 will not be repeated.

The first pad 450 may be disposed on an outermost region of the lower surface of the auxiliary substrate 340. For example, the first pad 450 may have a rectangular band shape. A shape of the first pad 450 is not limited to a rectangular band shape, and may be changed in various ways. The first pad 450 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. In addition, the first pad 450 may be configured as a connection electrode to be connected to the shielding layer 140.

The second pad 460 may be disposed at an edge of the auxiliary substrate 340, on an outer region of the lower surface of the auxiliary substrate 340, and adjacent to or spaced apart from the first pad 450 in a medial direction. For example, the second pad 460 may be provided as a plurality of second pads 460 disposed spaced apart from each other, and the plurality of second pads 460 may be formed of a conductive material such as copper (Cu), aluminum (Al), silver (Ag), tin (Sn), gold (Au), nickel (Ni), lead (Pb), titanium (Ti), alloys of Cu, Al, Ag, Sn, Au, Ni, Pb, or Ti, or the like. When the electronic component module 400 is mounted on the main substrate (not illustrated), the second pad 460 may be configured as a shielding pad for preventing inflow and radiation of electromagnetic waves through a lower portion of the auxiliary substrate 340. For example, when the electronic component module 400 is mounted on the main substrate (not illustrated), a shielding solder may be bonded to the second pad 460 to form a shielding wall to prevent the inflow and radiation of electromagnetic waves. For example, since a space of the second pad 460 in a medial direction forms a space sealed by the shielding solder bonded to the second pad 460, the inflow and radiation of electromagnetic waves may be prevented.

In addition, a portion of the plurality of second pads 460 may be connected to the first pads 450 through a connection pad 470 for grounding.

Figure 8:
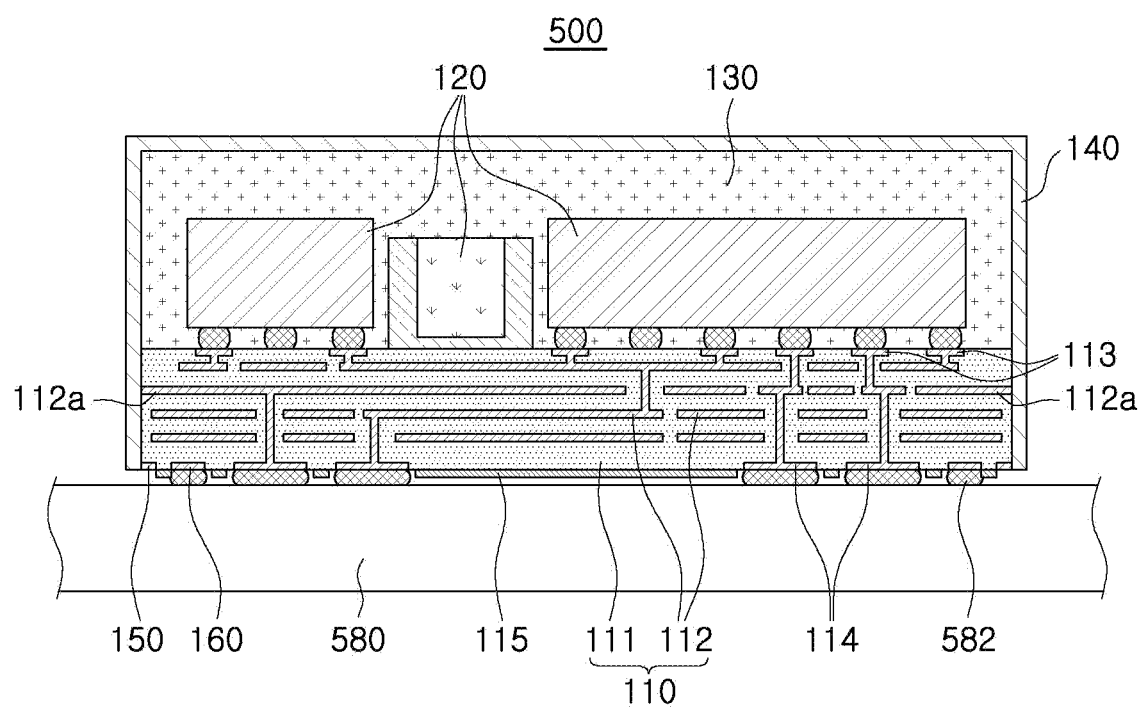
FIG. 8 is a cross-sectional view illustrating an electronic component module, according to an embodiment.

FIG. 8 is a cross-sectional view illustrating an electronic component module 500, according to an embodiment.

Referring to FIG. 8, the electronic component module 500 may include, for example, the substrate 110, the electronic element 120, the encapsulant 130, the shielding layer 140, the first pad 150, the second pad 160, and a main substrate 580.

Since the substrate 110, the electronic element 120, the encapsulant 130, the shielding layer 140, the first pad 150, and the second pad 160 have substantially the same configurations provided in the electronic component module 100 of FIG. 1, a detailed description of these components will not be repeated.

The substrate 110 may be mounted on the main substrate 580. When the substrate 110 is mounted on the main substrate 580, a shielding solder 582 may be disposed between the second pad 160 and the main substrate 580. For example, a space of the second pad 160 in a medial direction may be a space sealed by the shielding solder 582. Therefore, electromagnetic waves may be prevented from radiating from a lower portion of the substrate 110 through the second pad 160, or the electromagnetic waves may be introduced into the lower portion of the substrate 110.

According embodiments disclosed herein, configurations configured to shield electromagnetic waves radiated or introduced at a junction point with a main substrate may be provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component module, comprising:
   a substrate;
   an electronic element disposed on a first surface of the substrate;
   an encapsulant disposed on the first surface of the substrate and configured to seal the electronic element;
   a first pad disposed directly on an outermost region of a second surface of the substrate;
   a second pad disposed inward of the first pad and directly on the second surface of the substrate; and
   a shielding layer connected to the first pad, and at least partially surrounding a side surface of the encapsulant and a side surface of the substrate,
   wherein the first and second pads are electrically connected by a connection pad, and the first and second pads extend parallel to each other along a periphery of the second surface of the substrate.

2. The electronic component module according to claim 1, wherein the connection pad comprises a plurality of connection pads spaced apart from each other.

3. The electronic component module according to claim 1, wherein the second pad has a strip shape corresponding to a planar shape of the substrate.

4. The electronic component module according to claim 1, further comprising connection electrodes configured to electrically connect to a main substrate, and disposed inward of the second pad on the second surface of the substrate.

5. The electronic component module according to claim 1, wherein the substrate comprises a grounding wiring layer connected to the shielding layer.

6. The electronic component module according to claim 5, wherein the grounding wiring layer is exposed from the side surface of the substrate and connected to the shielding layer.

7. An electronic component module, comprising:
   a substrate;
   an encapsulant encapsulating a first electronic element disposed on a first surface of the substrate;
   an auxiliary substrate disposed on a second surface of the substrate and having a through-hole in which an electronic element is inserted;
   a first pad disposed on an outermost region of a lower surface of the auxiliary substrate;
   a second pad disposed inward of the first pad and on the lower surface of the auxiliary substrate, and positioned parallel to the first pad; and
   a shielding layer connected to the first pad and disposed to at least partially surround a side surface of the encapsulant, a side surface of the substrate, and a side surface of the auxiliary substrate;
   wherein the first and second pads are electrically connected by a connection pad.

8. The electronic component module according to claim 7, wherein the connection pad comprises a plurality of connection pads spaced apart from each other.

9. The electronic component module according to claim 7, wherein the second pad has a strip shape corresponding to a planar shape of the auxiliary substrate.

10. The electronic component module according to claim 7, wherein the second pad comprises a plurality of second pads spaced apart from each other, and
    wherein the plurality of second pads are disposed in the form of a segmented line.

11. The electronic component module according to claim 7, wherein the substrate comprises a grounding wiring layer connected to the shielding layer.

12. The electronic component module according to claim 11, wherein the grounding wiring layer is exposed from the side surface of the substrate and connected to the shielding layer.

13. An electronic component module, comprising:
    a main substrate;
    a substrate disposed on the main substrate;
    an electronic element disposed on a first surface of the substrate;
    an encapsulant disposed on the first surface of the substrate and configured to seal the electronic element;
    a first pad disposed on an outermost region of a second surface of the substrate;
    a second pad disposed inward of the first pad and on the second surface of the substrate, and positioned parallel to the first pad;
    a shielding layer connected to the first pad and disposed to at least partially surround a side surface of the encapsulant and a side surface of the substrate; and
    a shielding solder disposed in a space between the second pad and the main substrate,
    wherein the first and second pads are electrically connected by a connection pad.

14. The electronic component module according to claim 13, further comprising connection electrodes electrically connected to the main substrate, and disposed inward of the second pad on the second surface of the substrate.

15. The electronic component module according to claim 13, wherein the first pad is disposed along a substantially entire periphery of the second surface of the substrate.

16. The electronic component module of claim 13, wherein the shielding solder is in contact with the second pad.

17. An electronic component module, comprising:
    a substrate;
    an electronic element disposed on a first surface of the substrate;
    an encapsulant disposed on the first surface of the substrate and configured to seal the electronic element;
    a first pad disposed directly on an outermost region of a second surface of the substrate;
    a second pad disposed inward of the first pad and directly on the second surface of the substrate, and positioned parallel to the first pad; and
    a shielding layer connected to the first pad, and at least partially surrounding a side surface of the encapsulant and a side surface of the substrate,
    wherein the first and second pads are electrically connected by a connection pad,
    wherein the second pad comprises a plurality of second pads spaced apart from each other, and
    wherein the plurality of second pads are disposed in the form of a segmented line.

* * * * *